United States Patent [19]

Livermore et al.

[11] Patent Number: 5,015,600
[45] Date of Patent: May 14, 1991

[54] METHOD FOR MAKING INTEGRATED CIRCUITS

[75] Inventors: Frederick C. Livermore, Stittsville; John G. Hogeboom, Nepean; Go S. Sunatori, Hull, all of Canada

[73] Assignee: Northern Telecom Limited, Montreal, Canada

[21] Appl. No.: 470,027

[22] Filed: Jan. 25, 1990

[51] Int. Cl.⁵ .............................................. H01L 21/44
[52] U.S. Cl. ....................................... 437/51; 437/48; 437/187; 437/206; 357/45
[58] Field of Search .................. 437/51, 48, 49, 50, 437/205, 206, 187; 357/43, 45

[56] References Cited

U.S. PATENT DOCUMENTS

| | | | |
|---|---|---|---|
| 3,835,530 | 9/1974 | Kilby | 437/51 |
| 4,309,811 | 1/1982 | Calhoun | 437/51 |
| 4,786,613 | 11/1988 | Gould et al. | 437/48 |

FOREIGN PATENT DOCUMENTS

| | | | |
|---|---|---|---|
| 0206051 | 12/1982 | Japan | 437/48 |
| 0159557 | 9/1984 | Japan | 357/45 |
| 0051939 | 3/1986 | Japan | 437/51 |
| 0079241 | 4/1986 | Japan | 437/51 |
| 2089120 | 6/1982 | United Kingdom | 437/51 |

Primary Examiner—Brian E. Hearn
Assistant Examiner—Tuan Nguyen
Attorney, Agent, or Firm—C. W. Junkin

[57] ABSTRACT

In a method for making integrated circuits, a semiconductor substrate is provided which carries a plurality of unconnected devices of a first device type at regularly spaced regions of the substrate and a plurality of unconnected devices of a secound, distinct device type at substantially all regions of the substrate other than those carrying devices of the first device type, and at least one interconnection layer is formed on the substrate to interconnect selected ones of the devices of the first device type and the devices of the second device type to define a plurality of integrated circuits. Pad regions may be formed over unconnected devices for connection of the integrated circuits to package terminals. The integrated circuits are separated by regions containing unconnected devices, and the semiconductor substrate may be scribed and broken or otherwise cut in these regions to separate the integrated circuits.

9 Claims, 10 Drawing Sheets

METHOD FOR MAKING INTEGRATED CIRCUITS

FIELD OF THE INVENTION

This invention relates to methods for making integrated circuits in which generic base layers are used with different customized interconnection layers to implement different electronic functions. This invention also relates to generic base layer structures for use in performing such methods.

BACKGROUND OF THE INVENTION

In known methods for making integrated circuits of a class commonly known as "gate arrays", generic base layers are formed on a semiconductor wafer. The generic base layers usually define a large number of unconnected semiconductor devices such as bipolar transistors, MOS transistors or CMOS transistor pairs.

The semiconductor devices of the generic base layers are usually arranged on the wafer in an array of regularly spaced rectangular regions. Each rectangular region contains an identical arrangement of semiconductor devices and adjacent rectangular regions are separated by predefined empty bonding pad regions in which bonding pads will eventually be formed and predefined empty scribe regions in which the wafer will eventually be scribed to separate the rectangular regions to provide separate integrated circuits.

To complete the fabrication of integrated circuits implementing a specific electronic function, customized interconnection layers appropriate to that function are formed over the rectangular regions to interconnect the semiconductor devices so that they will perform the desired electronic function. The arrangements of interconnection layers applied to each of the rectangular regions are identical, and none of the interconnections cross the empty scribe regions which separate adjacent rectangular regions. The interconnection layers include bonding pads in the bonding pad regions which are often located around the periphery of the rectangular regions. The bonding pads are used for making external electrical connections to the integrated circuits. Once the interconnection layers are in place, the semiconductor wafer is scribed in the scribe regions, and the rectangular regions of the wafer are separated into individual die which are separately packaged as distinct integrated circuits.

The use of generic base layers in gate arrays simplifies, speeds up, standardizes and reduces the cost of designing integrated circuits to perform new electronic functions. Because the generic base layers are common to many integrated circuits and provide semiconductor devices which can be interconnected to perform many different functions, the design of integrated circuits performing new electronic functions requires only the design of a new set of interconnection layers to interconnect the devices of the generic base layers to perform the desired function. This is much simpler than designing a completely new set of base layers and interconnection layers as is done in the manufacture of custom integrated circuits. Moreover, because the electrical characteristics of devices formed in the generic layers are known to be good from previous uses of the generic base layers in other integrated circuits, less design verification effort is required.

The use of generic base layers also speeds up and reduces the cost of manufacturing integrated circuits based on those generic base layers. Because the generic base layers can be used in many different integrated circuits, they can be manufactured in large volumes to provide economies of scale. Wafers carrying only the generic base layers can be manufactured in large quantities and stockpiled for future completion by the addition of customized interconnection layers required for the implementation of new electronic functions.

In summary, the use of generic base layers permits manufacturers to meet many integrated circuit needs of their customers faster and cheaper than would be possible if each integrated circuit were designed without such generic layers as in the design of custom integrated circuits.

Unfortunately, there are limits to the benefits of the gate array design and manufacturing strategy which is described above. The complexity of the electronic functions that can be implemented using the generic base layers depends on the number and type of unconnected semiconductor devices provided in each of the regularly spaced rectangular regions of the wafer. If a very large number of unconnected semiconductor devices is provided in each rectangular region of the generic base layers to ensure that complex electronic functions can be implemented, then each of the rectangular regions will be relatively large, and a limited number of them will fit on a semiconductor wafer. This will limit the yield of integrated circuits per semiconductor wafer, a factor which will be reflected in the cost per integrated circuit. In this case, integrated circuits performing relatively simple electronic functions which do not require the large number of semiconductor devices provided in each rectangular region of the generic base layers will cost almost as much as integrated circuits performing significantly more complicated electronic functions implemented using the same generic base layers. However, if a smaller number of unconnected semiconductor devices is provided in each rectangular region of the generic base layers to increase the yield of integrated circuits per semiconductor wafer, it will not be possible to implement some more complex electronic functions on a single integrated circuit. Moreover, if different sets of generic base layers are provided for different levels of design complexity, this erodes the economies of scale which the use of generic base layers is meant to provide.

SUMMARY OF THE INVENTION

This invention seeks to provide a method for making integrated circuits which reduces some or all of the limitations described above.

This invention also seeks to provide a generic base layer structure for use in that method.

One aspect of the invention provides a method for making integrated circuits which comprises providing a semiconductor substrate carrying a plurality of drive devices at regularly spaced regions of the substrate and a plurality of logic devices at substantially all regions of the substrate other than those carrying drive devices, and forming at least one interconnection layer on the substrate to interconnect selected ones of the drive devices and the logic devices to define a plurality of integrated circuits each of which is capable of performing a desired electronic function. The integrated circuits are separated by regions containing unconnected devices.

Because the semiconductor substrate carries drive devices which are regularly distributed across the substrate and logic devices at substantially all regions of the substrate not carrying drive devices, both logic devices and drive devices are available at or near to all locations on the substrate. Thus, virtually any interconnection of drive devices and logic devices can be realized efficiently.

Pad regions for connection of the integrated circuits with package terminals may be formed over unconnected devices. The substrate may be scribed and broken or otherwise physically separated in the regions containing unconnected devices between the integrated circuits to separate the integrated circuits.

Because the pad locations and scribe or cut lines are not dictated by the topography of the generic base layers, they can be placed at virtually any convenient location on the substrate. More particularly, predefined pad locations and scribe or cut lines do not dictate a minimum or maximum area for each integrated circuit. Consequently, the area, aspect ratio and number of input/output locations for each integrated circuit can be tailored to the number of logic and drive devices required by that integrated circuit, and the number of integrated circuits fabricated per substrate can be optimized. A single substrate may even be partitioned to accommodate integrated circuits of several different sizes.

Another aspect of the invention provides a generic base layer structure for use in making integrated circuits. The generic base layer structure comprises a plurality of unconnected drive devices carried at regularly spaced regions of the substrate and a plurality of logic devices carried at substantially all regions of the substrate other than those carrying the drive devices.

This generic base layer structure can be used in the method described above to realize the benefits of that method.

Some or all of the regularly spaced regions which carry drive devices may also carry electrostatic discharge protection devices for connection across selected ones of the drive devices to protect those drive devices from electrostatic discharge when those drive devices are used to perform external drive functions. The electrostatic discharge protection devices may be diodes or punch through devices or active switches.

The unconnected drive devices may be distributed in "islands" which are regularly spaced in a continuous "sea" of unconnected logic devices. Each island may have a boundary region containing unconnected drive devices and an interior region which is surrounded by the boundary region and contains unconnected logic devices. Alternatively, the unconnected drive devices may be distributed in two orthogonal sets of stripes which define a grid, and the unconnected logic devices may fill interstices of the grid. The drive devices may be bipolar transistors and the logic devices may be CMOS transistor pairs.

Yet another aspect of the invention provides an integrated circuit. The integrated circuit comprises a semiconductor substrate, a plurality of drive devices carried at regularly spaced regions of the substrate, and a plurality of logic devices carried at substantially all regions of the substrate other than those carrying drive devices. Selected ones of the drive devices and the logic devices are interconnected by overlying interconnection layers to define a device capable of performing a predetermined electronic function.

Such integrated circuits result from the method described above.

The invention is not restricted to the arrangement of drive devices and logic devices, but could be applied to the arrangement of electronic devices of any two or more distinct types on a substrate for interconnection to form a plurality of integrated circuits.

BRIEF DESCRIPTION OF THE DRAWINGS

Embodiments of the invention are described below by way of example only. Reference is made to accompanying drawings, in which.

DETAILED DESCRIPTION OF EMBODIMENTS

Figure 1:
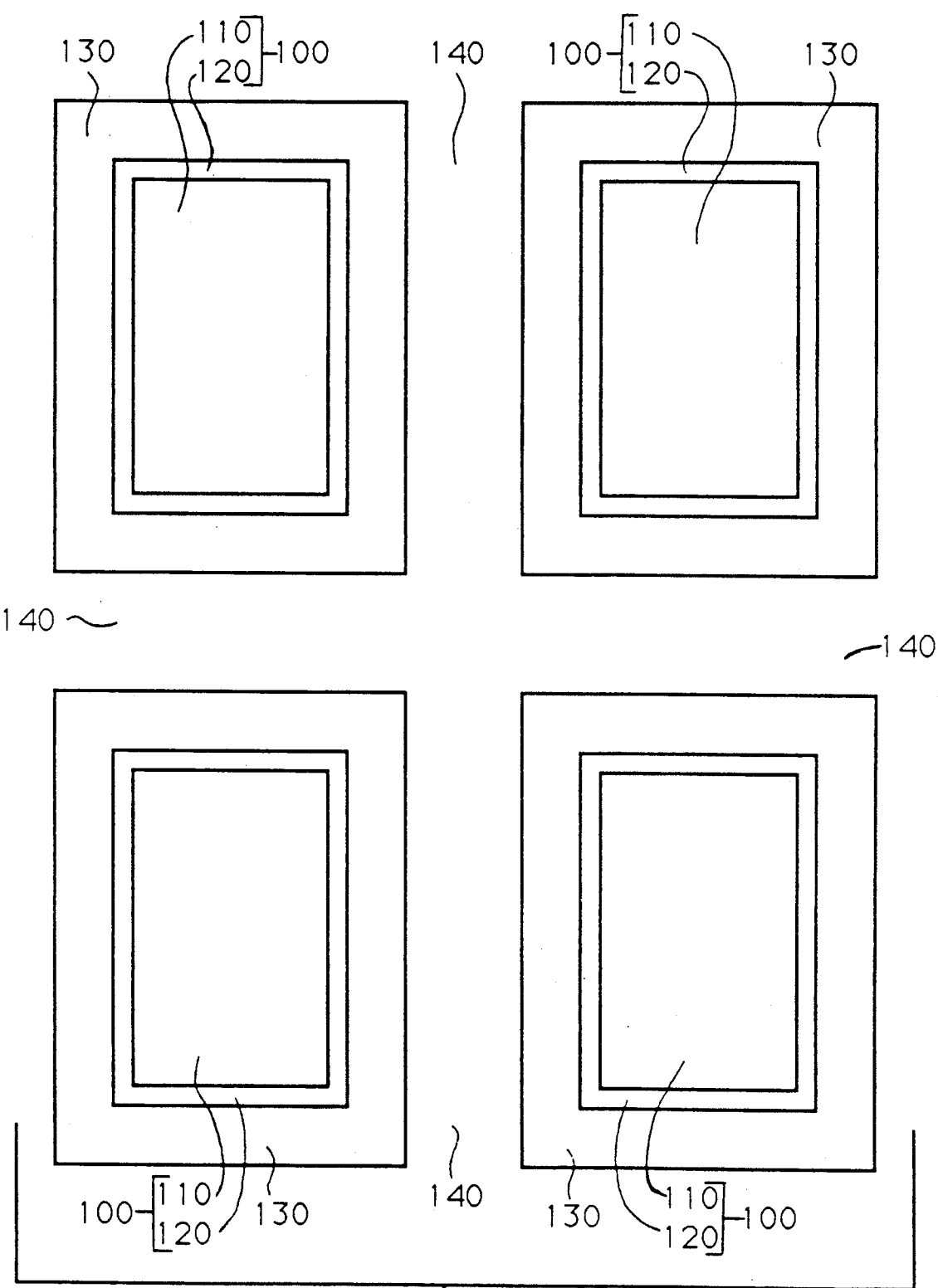
FIG. 1 is a schematic diagram showing the allocation of regions of a semiconductor substrate for the manufacture of conventional "gate array" integrated circuits.

FIG. 1 is a schematic diagram showing the allocation of regions of a small portion of a semiconductor substrate for the manufacture of conventional "gate array" integrated circuits.

In conventional manufacturing procedures for "gate array" integrated circuits, generic base layers are formed on a semiconductor wafer or substrate. The generic base layers define a large number of unconnected semiconductor devices, such as bipolar transistors, MOS transistors or CMOS transistor pairs. The unconnected devices are generally arranged in an array of regularly spaced rectangular regions 100, each of which contains an identical arrangement of devices. Each rectangular region generally comprises an interior region 110 which contains a large number of unconnected logic devices such as CMOS transistor pairs, and an exterior region 120 which contains a large number of unconnected drive devices such as bipolar transistors. Within the interior region 110, subregions of unconnected logic devices may be separated by empty channels over which interconnections may later be routed, or the entire interior region 110 may be filled with logic devices. In the latter case, sometimes called a "sea of gates" design, interconnections are later routed over some of the logic devices.

A region 130 around each rectangular region 100 is reserved for bonding pads which will be used to wire bond the individual integrated circuits to package terminals when the integrated circuits are completed, so no unconnected devices are provided in those regions 130. Regions 140 between the bonding pad regions 130 are left empty and are reserved for scribing or cutting the substrate to separate the integrated circuits when they are complete.

To manufacture integrated circuits implementing a specific electronic function, one or more interconnection layers are formed over the rectangular regions 100 to interconnect some of the unconnected logic devices and some of the unconnected drive devices so that the connected devices will perform the desired electronic function. The interconnection layer or layers also define bonding pads in the bonding pad region 130. The substrate is scribed or cut in the scribe regions 140 between the individual integrated circuits to separate the individual integrated circuits, and the separated integrated circuits are individually packaged for use.

The numbers of logic devices and drive devices available for interconnection are limited to the respective numbers of those devices in the interior and exterior regions 110, 120. If the electronic function to be performed is very complex, there may not be enough logic devices or drive devices in the regions 110, 120 to implement that function with a single integrated circuit. In this case, two or more different integrated circuits are separately designed, manufactured and packaged, and the packaged integrated circuits are connected externally to define a circuit which performs the desired function. Alternatively, a custom integrated circuit having the required numbers of logic devices and drive devices may be designed and manufactured, but this is an expensive and time consuming procedure.

On the other hand, if the electronic function to be performed is relatively simple, many (perhaps most) of the logic devices and drive devices in the interior and exterior regions 110, 120 will not be required to implement the desired electronic function. However, because of the fixed, predetermined locations of the bonding pad regions 130 and scribe regions 140, the unnecessary logic devices and drive devices must nonetheless be included in each individual integrated circuit. Because the cost of each integrated circuit is closely related to its area, such relatively simple integrated circuits will cost almost as much as more complex integrated circuits if manufactured in similar volumes. Once again, a custom integrated circuit having only the required numbers of logic devices and drive devices could be designed and manufactured, but the higher costs and greater time requirements for design of such a custom integrated circuit generally outweigh the cost of wasted logic and drive devices unless the integrated circuit is required in very large quantities.

More efficient use of the logic devices and drive devices provided in generic base layers can be obtained by developing a family of generic base layer designs having interior and exterior regions 110, 120 of different areas containing different numbers of logic and drive devices. The generic base layer design which best meets the requirements of the electronic function to be performed can then be selected. However, this procedure requires the design, manufacture, testing and management of several sets of generic base layers, and this erodes the economies of scale which the use of generic base layers is meant to provide.

Figure 2:
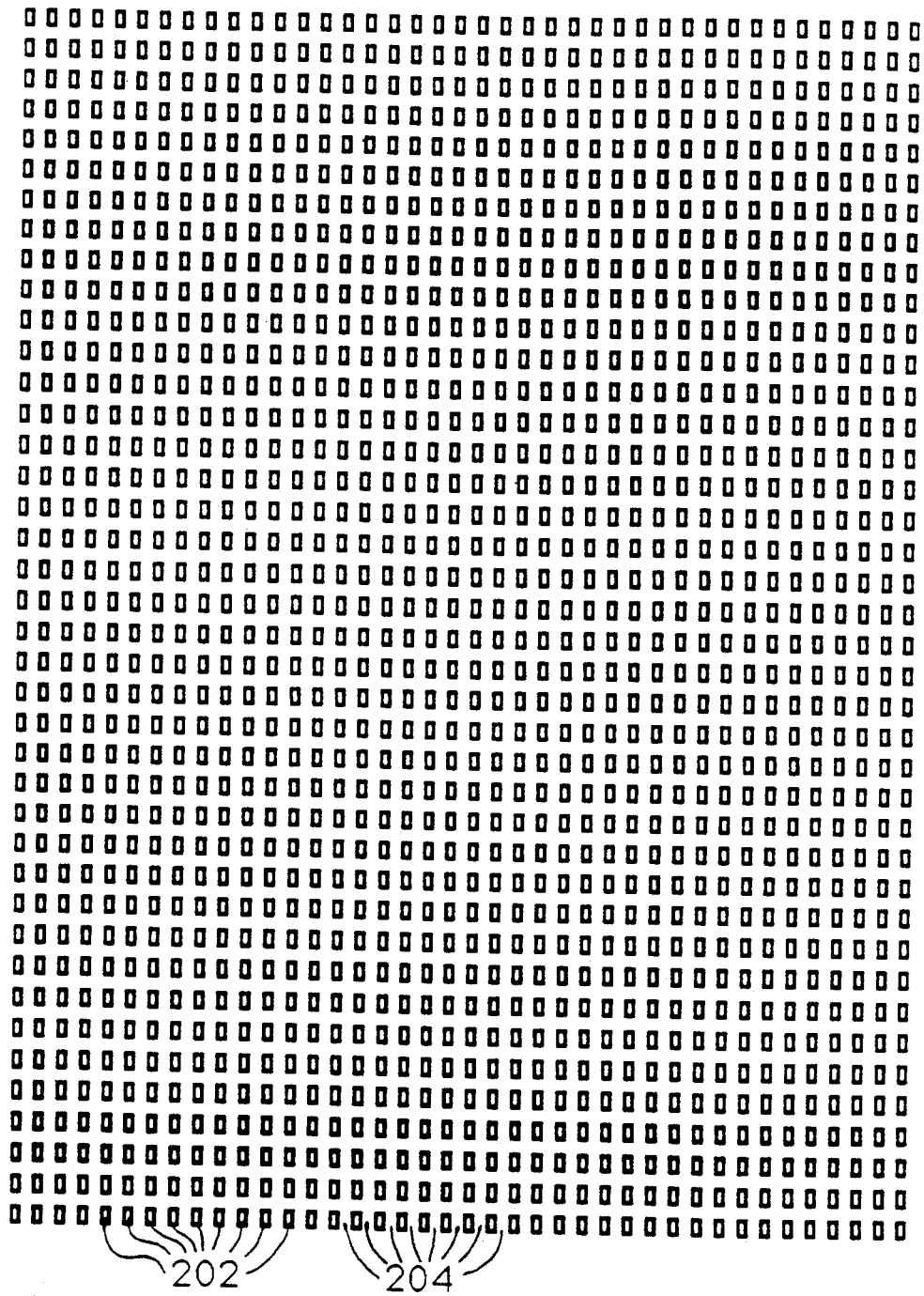
FIG. 2 is a schematic diagram showing the allocation of regions of generic base layers on a semiconductor substrate according to a first embodiment of the invention.

FIG. 2 is a schematic diagram showing the allocation of regions of generic base layers on a semiconductor substrate according to a first embodiment of the invention. A small number of unconnected drive devices, such as bipolar transistors, are provided in each of a large number of regularly spaced identical regions 202. Where bipolar drive devices are provided, they may all be of the same type (pnp or npn), or sets of complementary bipolar transistors may be provided. Alternatively, the drive devices may be large MOS devices. The regularly spaced identical regions also contain unconnected electrostatic discharge protection devices, such as diodes, punch through devices or active switches.

Substantially all regions 204 of the substrate not carrying drive devices (i.e. all regions around and between the regularly spaced regions 202) contain unconnected logic devices, such as CMOS transistor pairs. No regions are left empty for the placement of bonding pads or scribe channels as in more conventional methods of manufacturing "gate array" integrated circuits.

The regions 202 can be considered as "islands" of drive devices in a continuous "sea" 204 of logic devices. For example, each island 202 may contain a few unconnected drive devices and be separated from adjacent islands by several unconnected logic devices.

Figure 3:
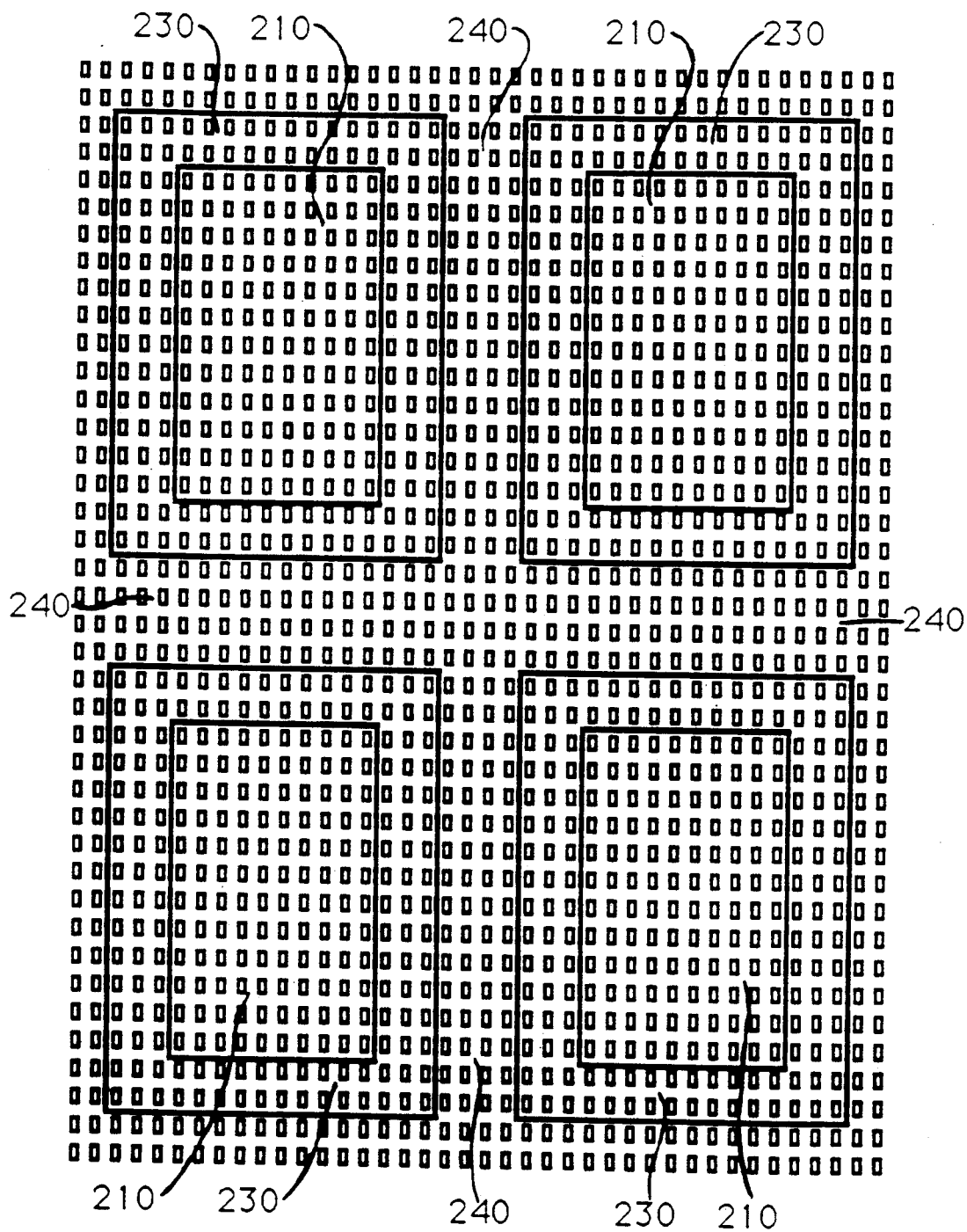
FIG. 3 is a schematic diagram showing the allocations of regions of the generic base layers of FIG. 2 after formation of an interconnection layer to define a first plurality of relatively complex integrated circuits.

To manufacture integrated circuits implementing a specific electronic function, one or more interconnection layers are formed over the regions 202, 204 to interconnect some of the unconnected logic devices and some of the unconnected drive devices in regularly spaced rectangular regions 210 shown in FIG. 3 so that the connected devices will perform the desired electronic function. The interconnection layer or layers also connect selected ones of the electrostatic discharge protection devices in series or parallel with selected ones of the drive devices which provide external drive functions to protect those drive devices from electrostatic discharge. The interconnection layer or layers also connect electrostatic discharge protection devices in series or parallel with signal lines from the pads to internal logic devices to protect those logic devices from electrostatic discharge. The interconnection layer or layers further define bonding pads in regions 230 surrounding the rectangular regions 210. The bonding pads are formed over unconnected logic and drive devices. Regions 240 of unconnected devices are left between the bonding pad regions 230, and the substrate is scribed or cut in these regions 240 to separate the individual integrated circuits. The separated integrated circuits are individually packaged for use.

Note that the locations of the bonding pad regions 230 and scribe regions 240 are not fixed by the features of the generic base layers. Consequently, the regularly spaced regions 210 of interconnected logic devices and drive devices need only be made as large as is required to provide enough logic and drive devices to implement the desired electronic function. Relatively complex electronic functions can be implemented by providing relatively large regions 210 of interconnected logic and drive devices. There is no arbitrary limit to the number of logic and drive devices which can be provided in a single integrated circuit apart from the very large number of logic and drive devices which can be provided on an entire substrate (although processing problems may limit the yield of integrated circuits which approach the area of the entire substrate).

Furthermore, the drive devices included within the interior regions 210 of each integrated circuit are not wasted. These drive devices can be used to provide more drive and hence higher speed for selected internal signals which must fan out to a relatively large number of other logic devices.

Figure 4:
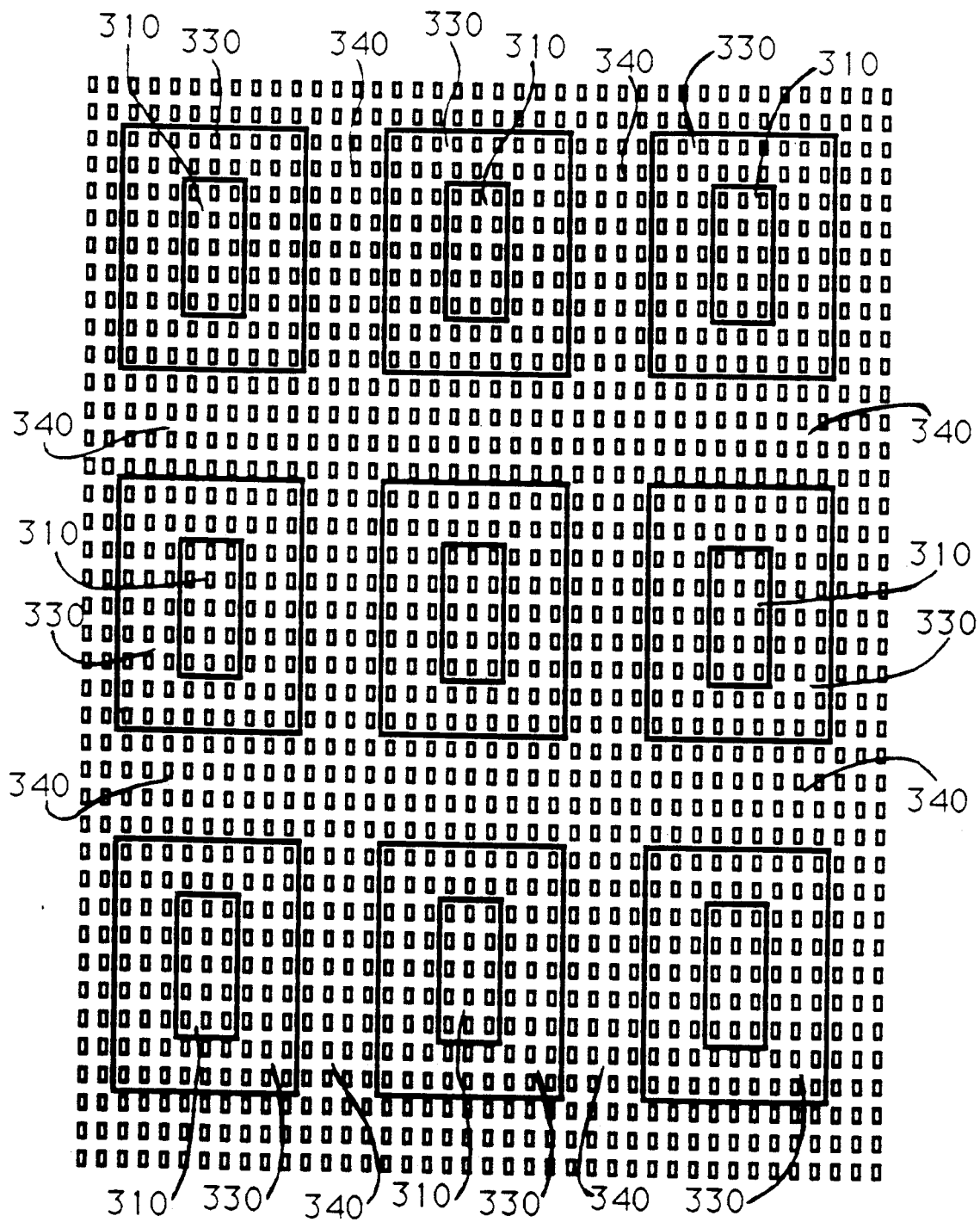
FIG. 4 is a schematic diagram showing the allocations of regions of the generic base layers of FIG. 2 after formation of an interconnection layer to define a second plurality of relatively simple integrated circuits.

Relatively simple electronic functions can be implemented by providing relatively small regions of interconnected logic and drive devices, thereby increasing the yield of a given area of the substrate. For example, FIG. 4 illustrates a possible configuration of interconnected device regions 310, bonding pad regions 330 and scribe channels 340 for implementing an electronic function which requires fewer logic and drive devices than the electronic function implemented by the integrated circuits illustrated in FIG. 3. Note that in FIG. 4 approximately the same area of the substrate yields a larger number of integrated circuits.

Figure 5:
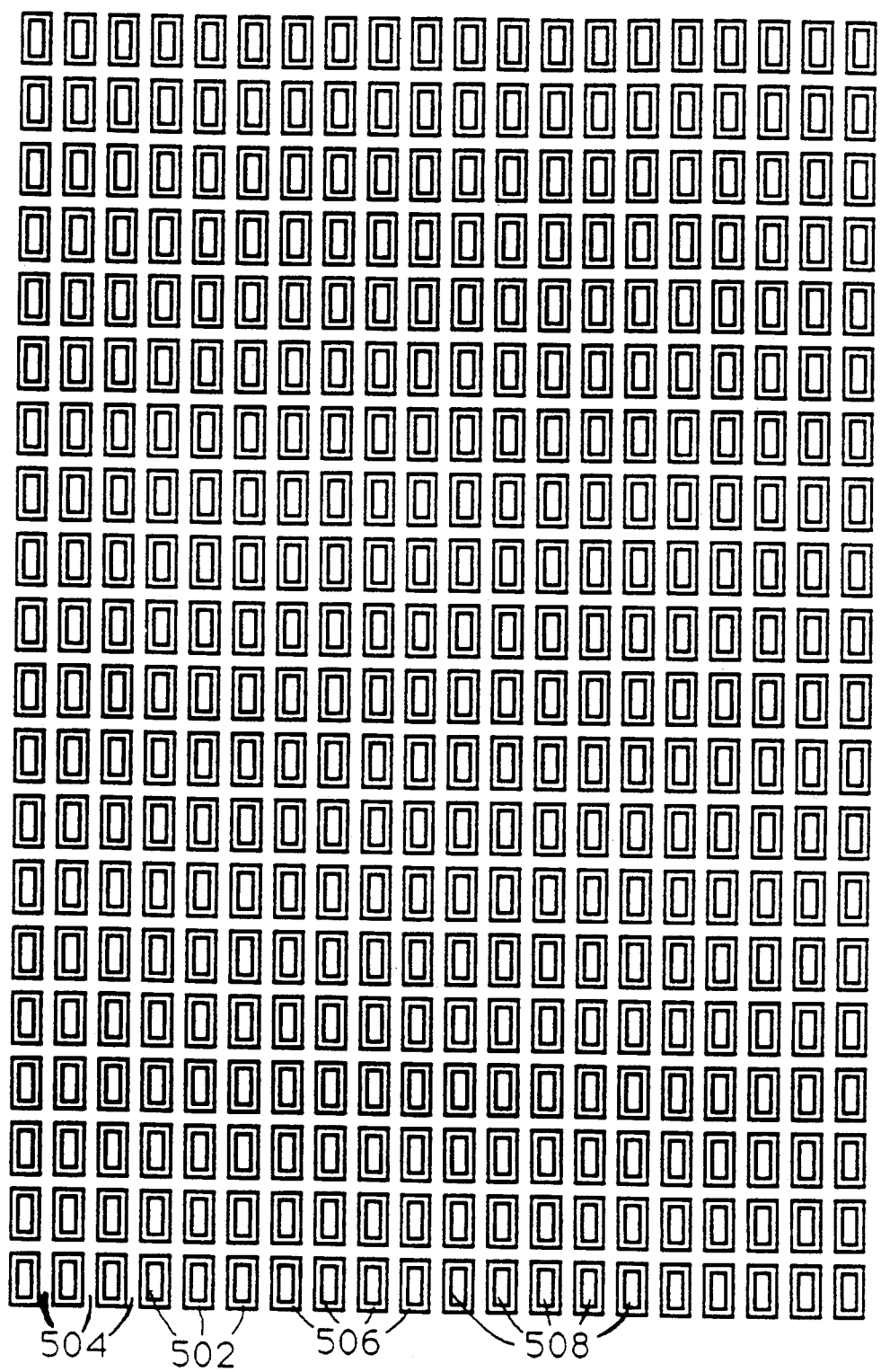
FIG. 5 is a schematic diagram showing the allocation of regions of generic base layers on a semiconductor substrate according to a second embodiment of the invention.

Arrangements of unconnected drive devices and logic devices other than the arrangement illustrated in FIGS. 2-4 can be used provided that drive devices are made available at or near all locations on the substrate, and logic devices are provided in substantially all locations not occupied by drive devices. For example, in a second embodiment illustrated in FIG. 5, unconnected drive devices are distributed in "islands" 502 which are regularly spaced in a "sea" 504 of unconnected logic devices, but each island 502 has a boundary region 506 containing the unconnected drive devices and an interior region 508 containing more unconnected logic devices.

Figure 6:
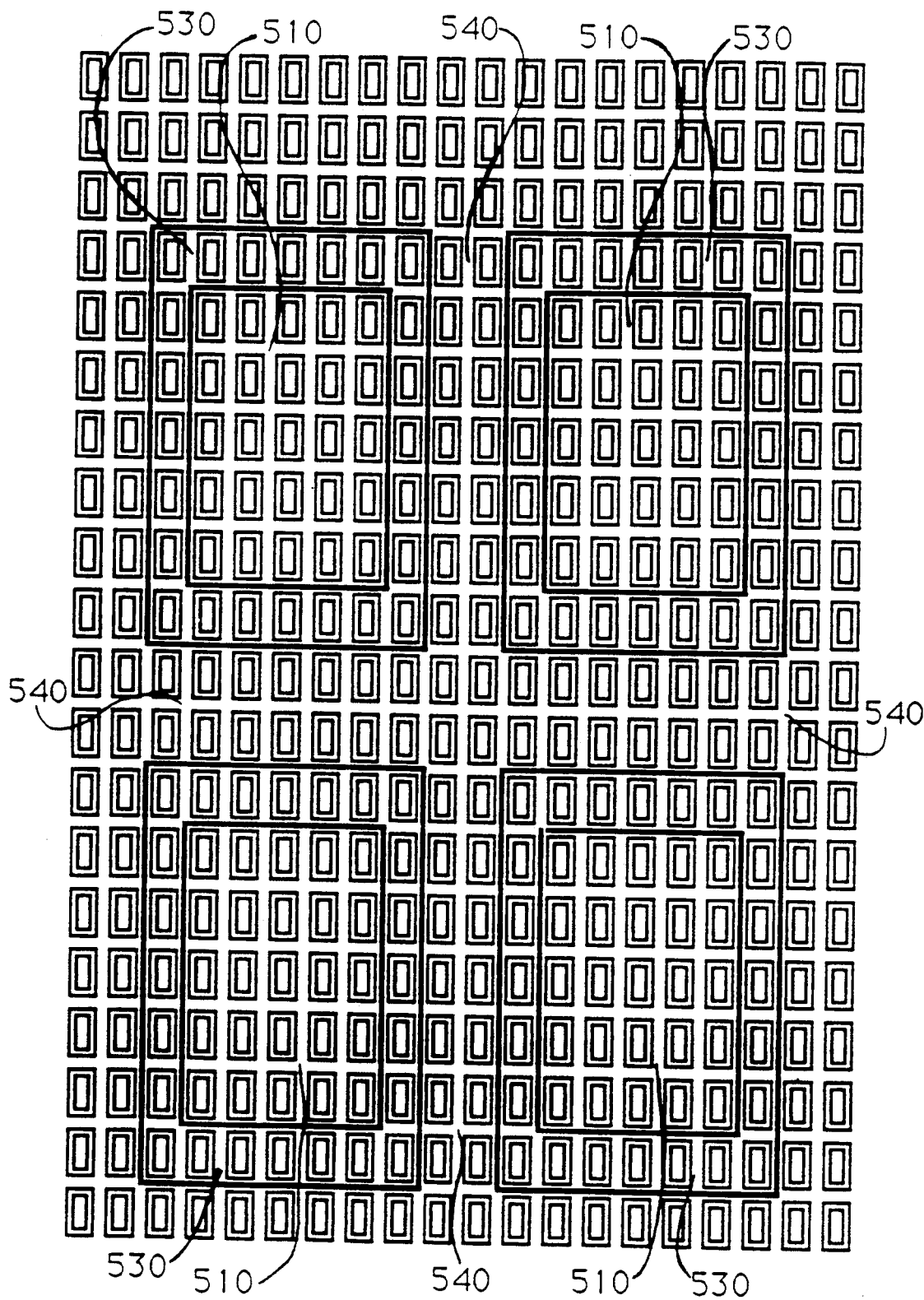
FIG. 6 is a schematic diagram showing the allocations of regions of the generic base layers of FIG. 5 after formation of an interconnection layer to define a plurality of relatively complex integrated circuits.
Figure 7:
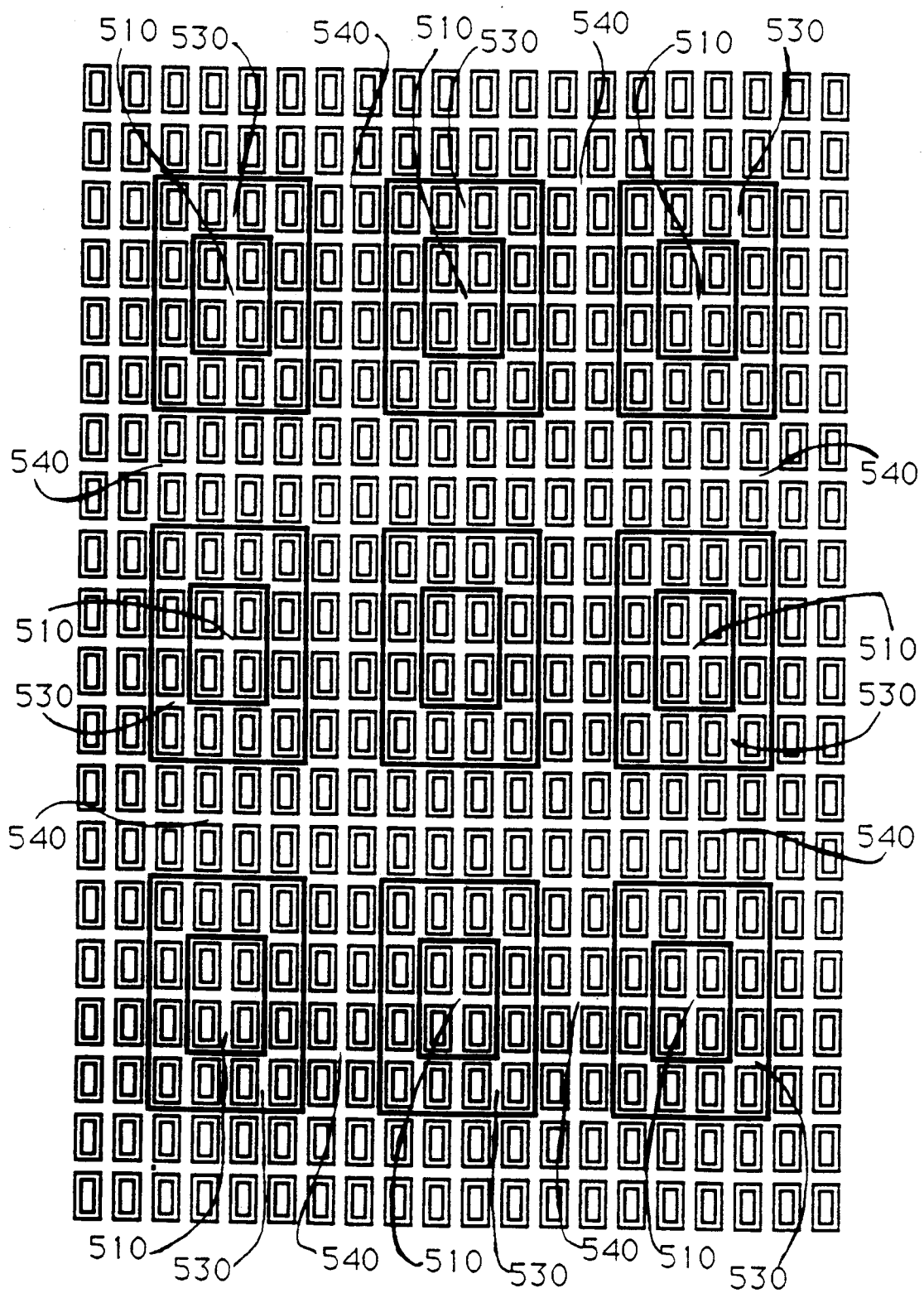
FIG. 7 is a schematic diagram showing the allocations of regions of the generic base layers of FIG. 5 after formation of an interconnection layer to define a second plurality of relatively simple integrated circuits.

FIGS. 6 and 7 show device interconnection regions 510, bonding pad regions 530 and scribe channels 540 of interconnection layers formed over the regions 502, 504 of the generic base layers to define relatively complex and relatively simple circuits respectively.

Figure 8:
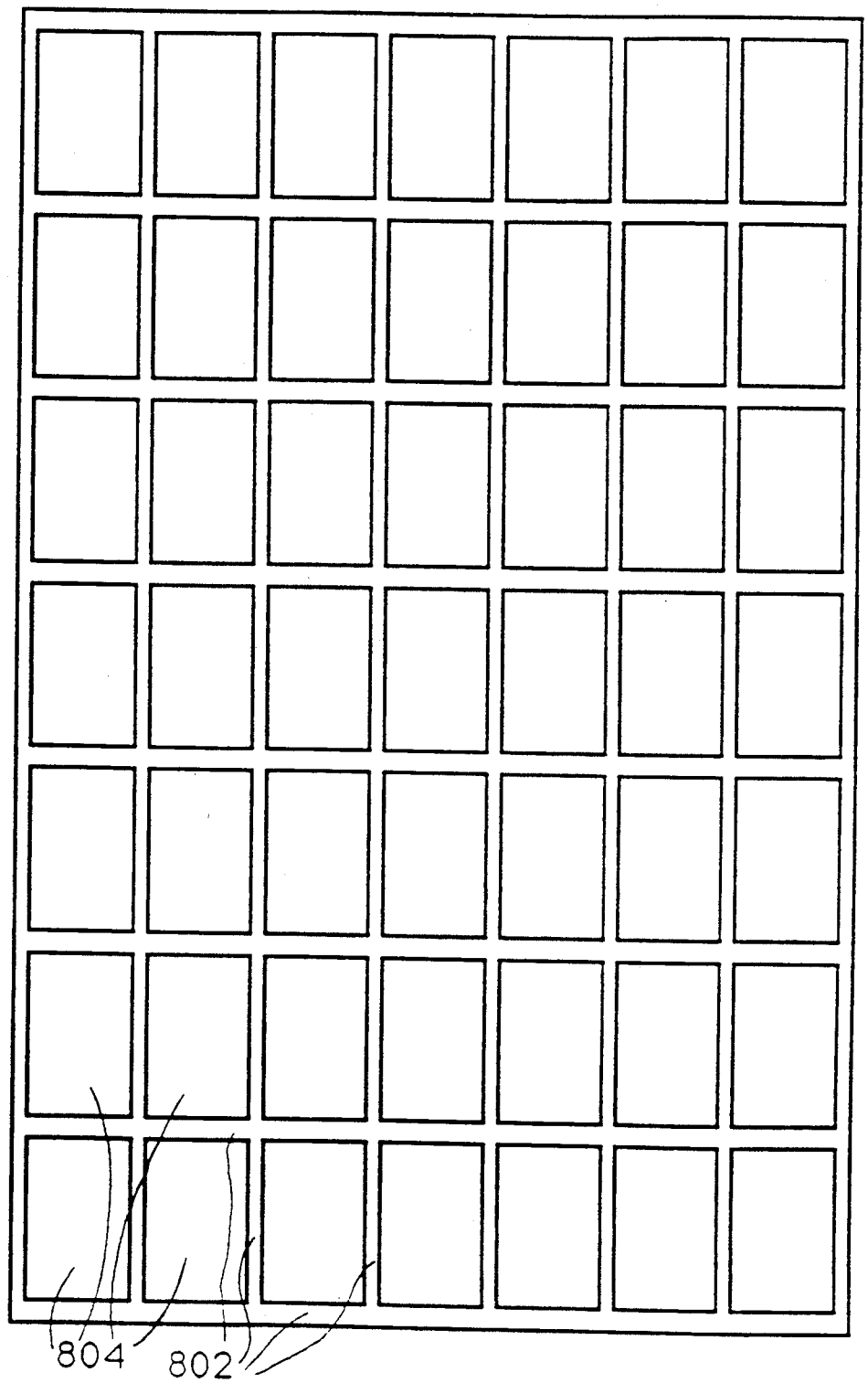
FIG. 8 is a schematic diagram showing the allocation of regions of generic base layers on a semiconductor substrate according to a second embodiment of the invention.

In a third embodiment illustrated in FIG. 8, unconnected drive devices and electrostatic discharge protection devices are distributed in two orthogonal sets of stripes which define a grid 802. As shown in FIG. 8, the stripes running in one direction may have a different width and spacing than the stripes running in the orthogonal direction. Advantageously, the stripes may be spaced by a distance corresponding to the sum of a predetermined bonding pad width and a predetermined scribe channel width. The interstices 804 of the grid 802 are filed with unconnected logic devices.

Figure 9:
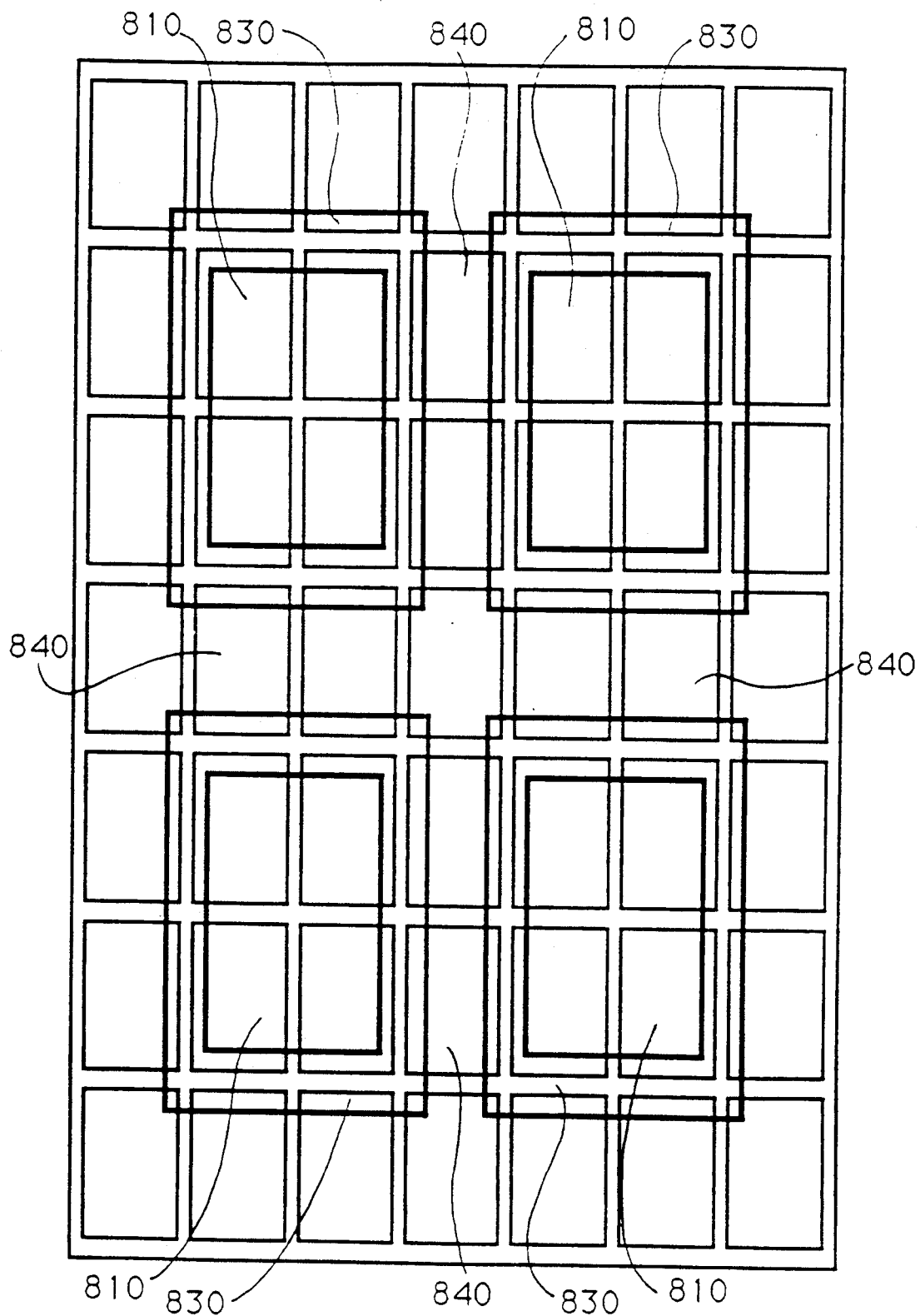
FIG. 9 is a schematic diagram showing the allocations of regions of the generic base layers of FIG. 8 after formation of an interconnection layer to define a plurality of relatively complex integrated circuits.
Figure 10:
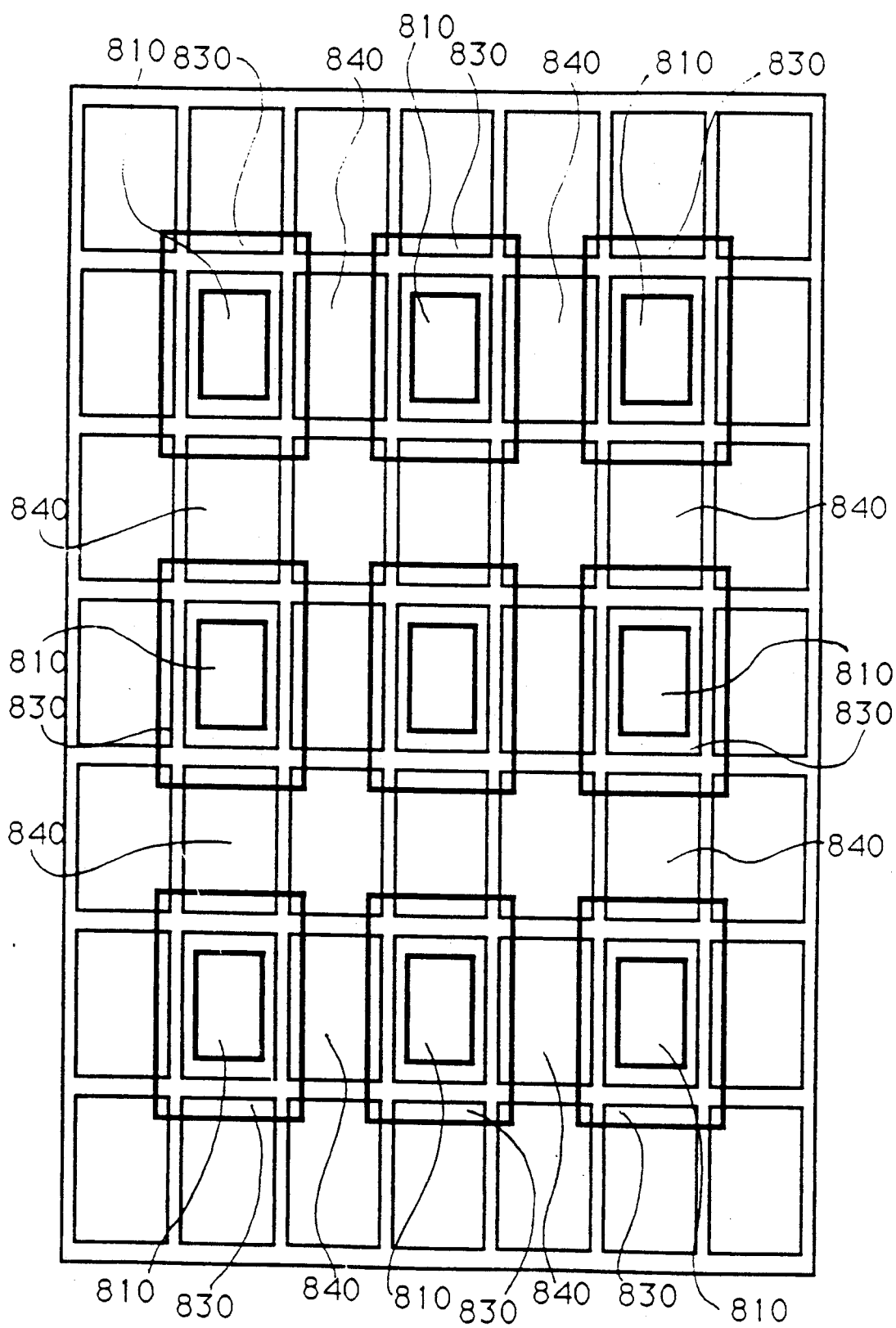
FIG. 10 is a schematic diagram showing the allocations of regions of he generic base layers of FIG. 8 after formation of an interconnection layer to define a second plurality of relatively simple integrated circuits.

FIGS. 9 and 10 show device interconnection regions 810, bonding pad regions 830 and scribe channels 840 of interconnection layers formed over the regions 802, 804 of the generic base layers to define relatively complex and relatively simple circuits respectively.

In the embodiments of the invention which are described above and in other embodiments of the invention which may be inferred from those described, the relative numbers of drive devices and logic devices can be selected based on the expected requirements of electronic functions likely to be implemented using the generic base layers. Electrostatic discharge protection devices can also be provided in numbers and arrangements which suit the expected applications. Generally, the electrostatic protection devices, if any, will be distributed with the drive devices.

The interconnection layers may include regions of ferroelectric material grown, deposited or otherwise formed over logic or drive devices to perform specialized electronic functions. In optoelectronic integrate circuits, the interconnection layers may even include optical interconnect or structures for optical coupling to devices on the integrated circuit.

Other types of devices may be provided in the generic base layers or interconnection layers where desired. For example, standard resistors could be distributed at regular intervals throughout the generic base layers for use in linear integrated circuits. Moreover, the invention is not restricted to the arrangement of logic devices and drive devices, but could be applied to the arrangement of electronic devices of any two or more distinct types on a substrate for interconnection to form a plurality of integrated circuits. For example, the two distinct types of devices could include linear and non-linear devices for use in mixed analogue/digital applications, or combinational logic functional blocks and test functional blocks for Built In Self Test (BIST) designs.

These and other variations of the basic inventive concept are within the scope of the invention as claimed below.

We claim:

1. A method for making integrated circuits, comprising:
   providing a semiconductor substrate carrying a plurality of unconnected drive devices at regularly spaced identical regions of the substrate and plurality of unconnected logic devices at substantially all regions of the substrate other than the regions carrying drive devices; and
   forming at least one interconnection layer on the substrate to interconnect selected ones of the drive devices and the logic devices to define a plurality of integrated circuits, each integrated circuit being capable of performing a desired electronic function, the integrated circuits being separated by regions containing unconnected devices.

2. A method as defined in claim 1, comprising providing a plurality of unconnected electrostatic discharge protection devices in at least some of the regularly spaced regions in which the drive devices are carried.

3. A method as defined in claim 1, comprising providing a plurality of unconnected drive devices selected from the group consisting of bipolar transistors and MOS drive transistors at regularly spaced identical regions of a semiconductor substrate and providing a plurality of unconnected CMOS transistor pairs at substantially all regions of the substrate other than those regions carrying bipolar transistors.

4. A method as defined in claim 1, comprising providing a plurality of unconnected drive devices selected from the group consisting of bipolar transistors and MOS drive devices, and electrostatic discharge protection devices from the group consisting of diodes, resistors, punch through devices and active switches at regularly spaced identical regions of a semiconductor substrate and providing a plurality of unconnected CMOS transistor pairs at substantially all regions of the substrate other than those regions carrying bipolar transistors and electrostatic protection diodes.

5. A method as defined in claim 1, comprising forming bonding pad regions over unconnected devices for connection of the integrated circuits with package terminals.

6. A method, as defined in claim 1, further comprising scribing the substrate in the regions containing unconnected devices between the integrated circuits and breaking the substrate where scribed to separate the integrated circuits.

7. A method as defined in claim 1, further comprising cutting the substrate in the regions containing unconnected devices between the integrated circuits to separate the integrated circuits.

8. A method as defined in claim 1, comprising forming a plurality of interconnection layers to interconnect selected ones of the drive devices and the logic devices to define a plurality of integrated circuits, each integrated circuit being capable of performing a desired electronic function, the integrated circuits being separated by regions containing unconnected devices.

9. A method for making integrated circuits, comprising:

providing a semiconductor substrate carrying a plurality of unconnected devices of a first device type at regularly spaced identical regions of the substrate and a plurality of unconnected devices of a second, distinct device type at substantially all regions of the substrate other than the regions carrying devices of the first device type; and forming at least one interconnection layer on the substrate to interconnect selected ones of the devices of the first device type and the devices of the second device type to define a plurality of integrated circuits, each integrated circuit being capable of performing a desired electronic function, the integrated circuits being separated by regions containing unconnected devices.

* * * * *